United States Patent

Corey et al.

[11] Patent Number: 6,042,648
[45] Date of Patent: Mar. 28, 2000

[54] VERTICAL CIRCUIT BOARD SOLDERING APPARATUS

[76] Inventors: Dave O. Corey, 9109 Williams Rd., Rogers, Ark. 72756; David J. Dye, 117 Augus Dr., Prairie Grove, Ark. 72753

[21] Appl. No.: 08/892,983

[22] Filed: Jul. 15, 1997

[51] Int. Cl.[7] ..................................................... B05C 3/00
[52] U.S. Cl. ............................ 118/423; 118/63; 118/425; 118/503; 269/903
[58] Field of Search ..................................... 118/503, 423, 118/424, 425, 63; 269/115, 116, 903, 203, 221, 60

[56] References Cited

U.S. PATENT DOCUMENTS

| | | | |
|---|---|---|---|
| 2,779,091 | 1/1957 | Harwood | 269/203 |
| 3,826,483 | 7/1974 | Siegel | 269/203 |
| 4,277,518 | 7/1981 | Schillke et al. | 427/96 |
| 4,407,229 | 10/1983 | Sanborn | 118/425 |
| 4,527,508 | 7/1985 | Juve | 118/425 |
| 4,678,169 | 7/1987 | Frishmann et al. | 269/903 |
| 4,706,602 | 11/1987 | Polacek | 118/63 |
| 5,007,369 | 4/1991 | Morris | 118/56 |
| 5,038,706 | 8/1991 | Morris | 118/666 |
| 5,092,266 | 3/1992 | Kuo | 118/503 |
| 5,209,782 | 5/1993 | Morris | 118/603 |
| 5,226,964 | 7/1993 | Meuche | 118/424 |
| 5,512,098 | 4/1996 | French et al. | 118/503 |

Primary Examiner—Brenda A. Lamb
Attorney, Agent, or Firm—Stephen P. Carver

[57] ABSTRACT

A vertical circuit board soldering apparatus for soldering printed circuit boards by immersing them in a molten solder bath. Air knives are employed to remove excess solder from boards leaving the bath. A displacement mechanism vertically dips the circuit boards. The mechanism comprises a parallelepiped frame that comprises two spaced apart parallel rails securing a sliding chassis therebetween. The chassis comprises three parallel spaced apart members. An upper member transversely extends between the rails while captivating a portion of each rail adjacent its ends. A parallel lower member depends from the upper member with an adjustable intermediate member therebetween. The intermediate member also transversely extends between the rails while captivating another portion of the rails. The intermediate member is coupled to the upper member by a screw jack that moves the intermediate member upwardly or downwardly to vary the distance therebetween to accommodate various board sizes. The intermediate member supports a pneumatic clamp that grasps the upper edge of an inserted circuit board. A holder on the lower member grasps the opposite lower edge of the circuit board to cooperatively stabilize it therebetween. The lower member comprises an elongated bar extending across the top of the bath penetrated by several regularly spaced, threaded holes. The holes enable the bar to quickly shed molten solder entrained thereon. The holder may be either a grooved bracket or a J-shaped hook. An intermediate member shaft moves between spaced apart rollers to ensure alignment. An alignment assembly ensures front-to-back solder uniformity.

14 Claims, 10 Drawing Sheets

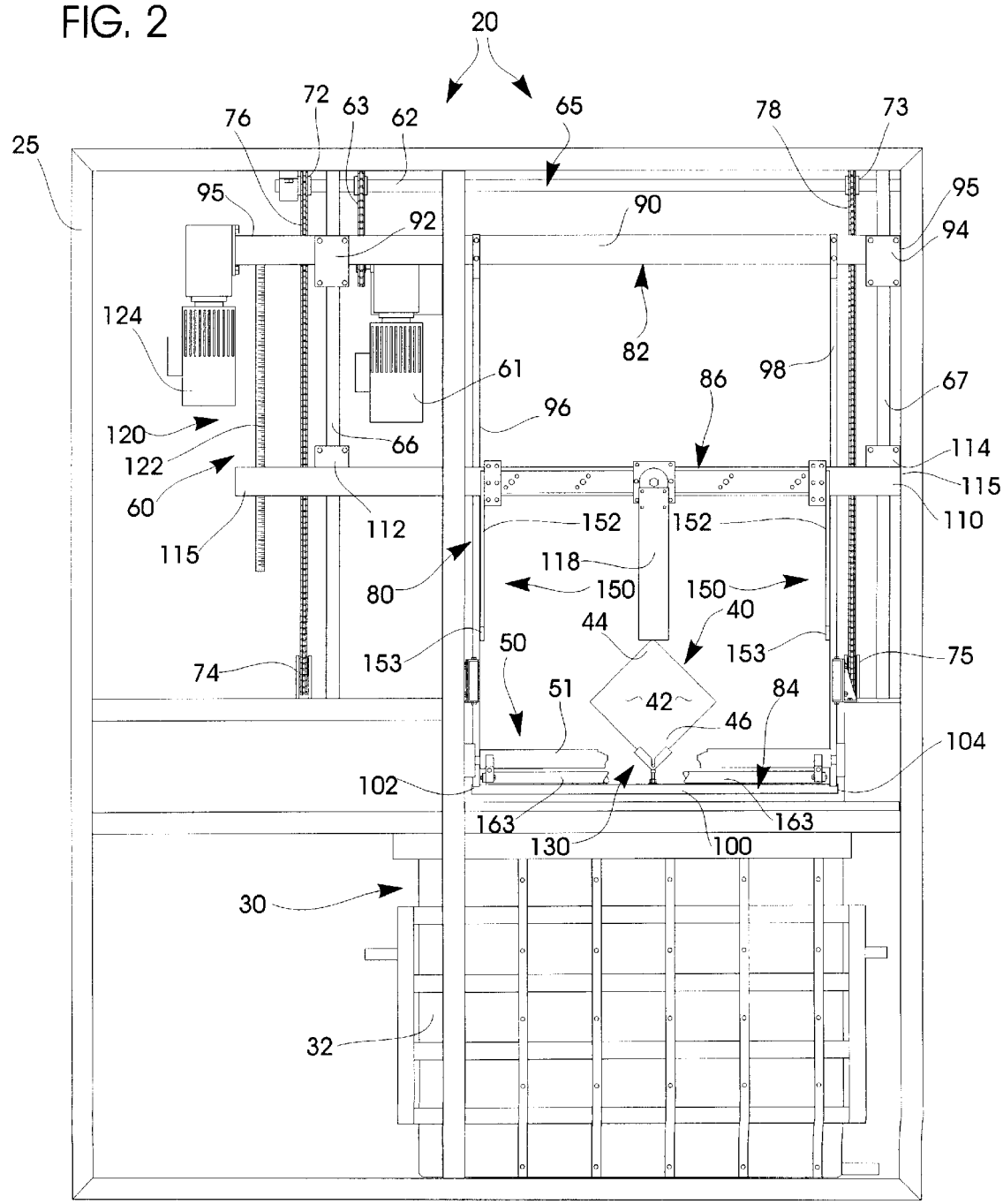

VERTICAL CIRCUIT BOARD SOLDERING APPARATUS

BACKGROUND OF THE INVENTION

I. Field of the Invention

The present invention relates generally to industrial hot air solder leveling of printed circuit boards. In particular, the present invention relates to a vertically oriented system that solders circuit boards while they are captivated by spaced apart holders. Related prior art may be found in U.S. Class 118, subclasses 56, 63, 424 and 425 among others.

II. Description of the Prior Art

As will be recognized by those skilled in the art, printed circuit boards are typically mass soldered in a conventional process involving a solder bath during manufacture. Solder coating machines coat the board with a layer of solder as the board is quickly dipped in or otherwise passed through a hot, liquid solder bath. Optionally, such coating systems may employ pneumatic knives that clean boards as they emerge from the bath by removing excess solder. The knives typically blow molten solder away from desired through holes and the like.

The known prior art includes systems in which the boards are either horizontally or vertically inserted into the solder bath. Conventional horizontal systems move the board through the solder bath between controlled pairs of drive rollers that guide the board in and out of the bath. Examples of horizontal circuit board soldering systems are shown in U.S. Pat. Nos. 4,227,518, 5,007,369, 5,038,706 and 5,209,782. All of the devices described in the aforementioned patents solder the printed circuit board as it travels horizontally across spaced apart rollers in the solder bath.

However, horizontal soldering machines often do not perform satisfactorily. Problems experienced with horizontal soldering machines include board breaking because of undue stress during soldering, inefficient solder adhesion on the top board surface and the like. Thus, vertically oriented solder machines have recently become popular with some printed circuit board manufacturers.

Vertical systems typically secure the circuit boards during processing with a clamp that grips the top of the board. For example, U.S. Pat. No. 4,706,602, describes a clamp for holding circuit boards at one edge. Alternatively, some vertical systems employ drive rollers as well as shown in U.S. Pat. No. 5,226,964. Regardless of the clamping apparatus, the system ordinarily dips the board into a hot, liquid solder bath and then removes it after a predetermined residence time.

While vertical systems overcome several of the problems associated with horizontal systems, particularly complete board coating, they are not without unique problems of their own. For one, known vertical soldering machines often experience a stability problem with large circuit boards. In other words, the larger the board being soldered, the less stable mechanically it becomes as it traverses the solder bath. This instability causes the board to vibrate or waffle as it leaves the bath, resulting in imprecise solder adhesion and/or non-uniform solder adhesion. Since the circuits themselves often require precision to the millionth of an inch in solder thickness, board instability is often a significant problem.

The inherent structural instability of the larger boards often directly contributes to the lower precision in their soldered connections because of the stresses involved in the soldering process. For example, boards held on only one edge often vibrate as they are raised from the solder bath. This vibration problem is exacerbated by the conventional air knives employed to remove excess or entrained solder from the boards. As the boards vibrate, the connections on their surfaces are subjected to varying air flows and the thickness of the connections correspondingly vary as well. This varying thickness causes imprecise component mounting in the assembly process. As may well be imagined, such imprecision adversely affects board performance.

One obvious method of alleviating the stability problem is to simply increase the clamp grip area. In other words, the larger the grip area of the clamp, the greater the stability. However, as the clamp grip area increases, less circuit board surface is available for soldering (i.e., circuitry space is reduced). Further, modern circuit boards are lightweight and thin. The thinner the board, the more likely it is to experience damage from the clamping mechanism, as clamping forces are concentrated upon only a narrow area of the board. Since the board is grasped at a top edge by a large clamp in a conventional vertical system, it can subject a portion of the board to extreme stress. Further, since most clamps are pneumatically operated and the boards are generally plastic resin, the boards are comparatively fragile and easily broken by the clamps.

One means of addressing the stability problem is to add some form of dynamic holding apparatus to the clamp system that grips the bottom of the circuit board. For example, if both diametrically opposed corners of a board could be grasped by the clamping mechanism, greater stability would result. However, in the prior art when the latter approach has been employed, problems can occur. For example, systems employing such clamping mechanisms immerse the bottom clamp member in the solder bath. When the board is withdrawn from the bath, excess hot solder may be splashed about the machine. Splashing can damage the machine and injure an operator. Additionally, splashing wastes valuable solder, and slows down the manufacturing process.

Therefore it is desirable to provide soldering means whereby a printed circuit board may be securely clamped at opposed ends to stabilize the board during the soldering process. An ideal soldering machine would use an added clamping apparatus that prevented wasteful and potentially dangerous solder splashing during board removal. An ideal solution would stabilize the boards while preventing splashing and minimizing board damage to maximize system throughput.

SUMMARY OF THE INVENTION

My vertical circuit board soldering apparatus overcomes several of the problems associated with the known prior art machines. The apparatus securely clamps opposite circuit board ends to stabilize the board during the soldering process. The machine preferably uses a lower clamping apparatus that resists solder splashing when the board is removed from the bath. Thus, my improved machine stabilizes conventional printed circuit boards during soldering while preventing splashing and minimizing board damage.

My vertical circuit board soldering machine employs a conventional solder bath system in which to immerse the boards. The system comprises a soldering machine that houses a bath in which the circuit boards are dipped during processing. The bath contains an open topped reservoir of molten solder that completely covers the boards when they are inserted therein. Preferably, at least two air knives or the like forcefully blow entrained or excess solder from the board as it is raised out of the bath.

An operator controlled displacement mechanism dips the circuit boards into the bath. The displacement mechanism preferably comprises a generally parallelepiped frame proximate the bath. The frame comprises a pair of spaced apart parallel rails that proximately abut the bath. A moving chassis slides up and down the rails when selectively actuated by an operator controlled remote motor.

The chassis comprises at least three parallel, spaced apart members. The upper member preferably transversely extends between the rails. Preferably, the upper member slidably captivates a portion of each rail adjacent each of its ends. A spaced apart, parallel lower member depends from the upper member. An adjustable intermediate member is preferably disposed between the upper and lower members.

The intermediate member preferably also transversely extends between the rails parallel to the upper member but beneath it. The intermediate member also slidably captivates another portion of the rails adjacent each of its ends. Preferably, one end of the intermediate member is coupled to the corresponding upper member end by a screw jack. The screw jack may be manipulated by an operator to move the intermediate member upwardly or downwardly with respect to the upper member (preferably via an electric motor). Thus, the distance between the intermediate member and the lower member may be selectively adjusted to accommodate various board sizes. The intermediate member supports a pneumatic clamp that grasps the upper edge of an inserted circuit board. A holder on the lower member grasps the opposite lower edge of the circuit board to cooperatively stabilize it therebetween.

The lower member comprises an elongated bar extending across the top of the bath. Since the bar is inserted into the bath during board dipping, it is important that the bar length does not exceed the mouth width of the bath. Preferably, the bar is penetrated by several regularly spaced, threaded holes. The holes enable the bar to quickly shed an molten solder entrained upon its top surface when the bar emerges from the bath. The holes are also used to attach a lower holder to the bar. In the preferred embodiments, the holder may be either a grooved bracket or a J-shaped hook. The holder grips a portion of the circuit board during dipping to stabilize the board. The holder cooperates with a clamp upon an intermediate member to stabilize the board during dipping to prevent lateral or other undesirable board movements.

A spreader assembly comprising a pair of spaced apart upper shafts mounted on the intermediate member and corresponding spaced apart receiving rollers adjacent the air knives cooperatively space the knives during use. The shafts and rollers align along the extreme edges of the chassis and bath respectively. Each shaft preferably comprises an elongated body with a tapered end. Each end contacts a respective pair of rollers. The rollers move apart to receive the shaft as the chassis moves downwardly. As the chassis moves upwardly, the rollers move along the shaft body until the tapered end leaves the rollers. When the end departs, the rollers move back to their initial position.

The air knives are preferably automatically activated by conventional proximity switches or the like as the chassis moves downwardly. As the chassis moves upwardly and the operator releases the top clamp, the air knives cease operating. The knives are then reset until the rollers again activate the proximity switches.

An alignment assembly ensures that the distance from the air knife orifice to circuit board surface remains constant during use. The alignment assembly comprises an elongated tubular roller spaced apart from each air knife assembly by an adjustable rod. The rollers ensure front-to-back circuit board uniformity. Preferably, the rollers are Teflon coated to increase their operational life while maintaining their guidance capability.

Thus, a primary object of the present invention is to increase the reliability and efficiency of printed circuit board soldering by redundantly stabilizing printed circuit boards during soldering.

A related basic object is to provide a means to securely, non-destructively grip a printed circuit board at its opposite extremes to prevent instability during soldering.

A related object is to provide a clamping apparatus that may be quickly and conveniently adjusted to accommodate different sizes of circuit boards.

Yet another basic object of the present invention is to provide a printed circuit board soldering machine that facilitates precise soldering by preventing undesirably board movement during board withdrawal from the bath.

Another primary object of this invention is to provide a splash-minimizing soldering system for printed circuit boards.

Another basic object is to provide a soldering machine that does not injure the operator with splashed solder when the board is withdrawn from the solder bath.

A related object of the present invention is to provide a clamping system that secures opposite circuit board edges during soldering without wasting valuable solder during board removal.

Another related object is to provide precise control of the air knives to prevent undesirable slag blowing during board bath entry and removal from the chassis.

These and other objects and advantages of the present invention, along with features of novelty appurtenant thereto, will appear or become apparent in the course of the following descriptive sections.

BRIEF DESCRIPTION OF THE DRAWINGS

In the following drawings, which form a part of the specification and which are to be construed in conjunction therewith, and in which like reference numerals have been employed throughout wherever possible to indicate like parts in the various views:

FIG. 2 is a partially fragmented front elevational view of the invention, with portions broken away or omitted for clarity;

DETAILED DESCRIPTION

Figure 1:
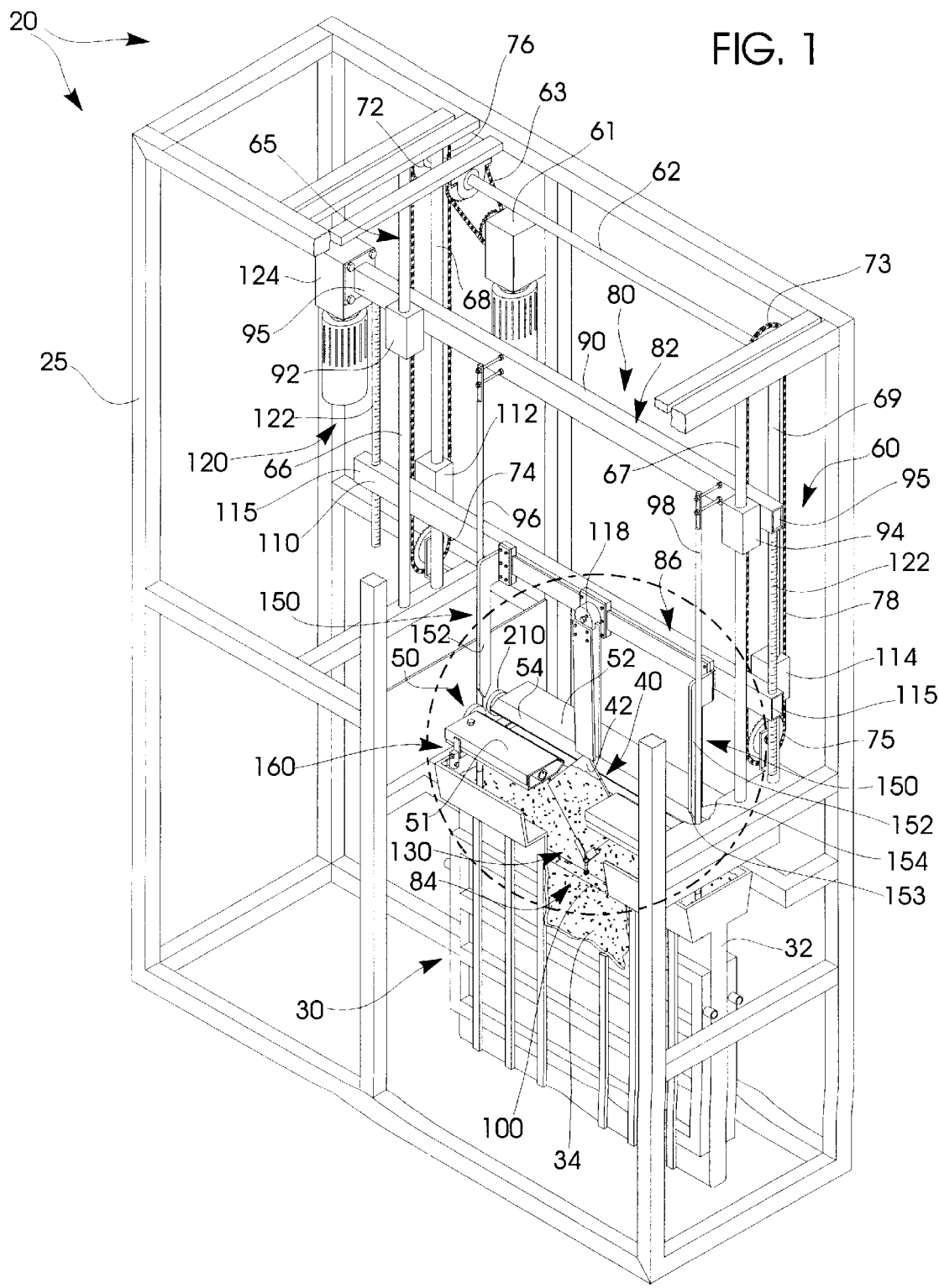
FIG. 1 is a partially fragmented, frontal isometric view of a preferred embodiment of the invention, with portions broken away or omitted for clarity.

Referring more specifically to the drawings, my improved vertical circuit board soldering apparatus is generally designated by reference numeral 20 in FIGS. 1–12. The machine 20 employs a conventional solder bath system 30 in which to immerse a printed circuit board 40 during manufacture.

Figure 1A:
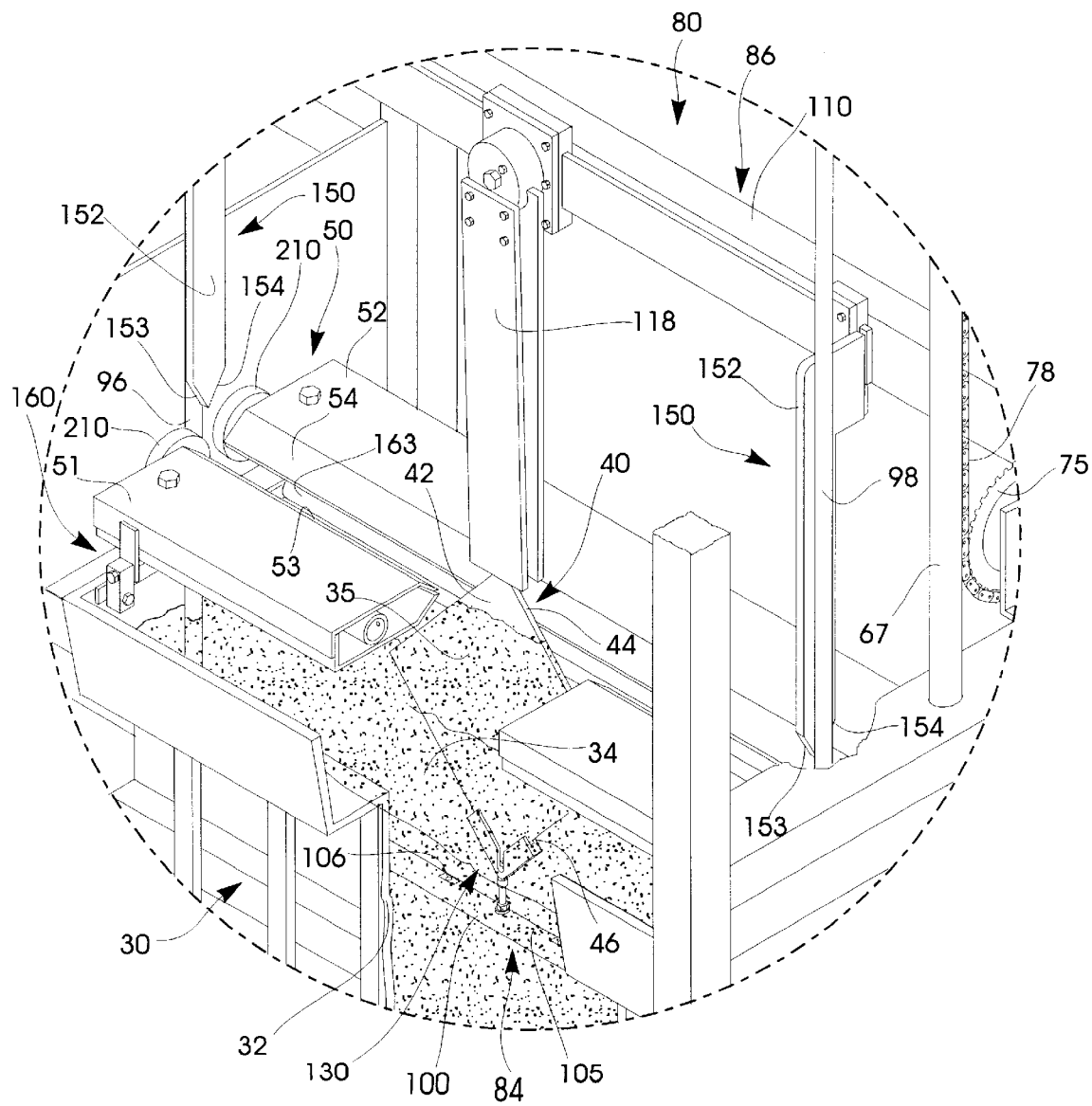
FIG. 1A is an enlarged view of the encircled portion of FIG. 1, with portions broken away or omitted for clarity.
Figure 3:
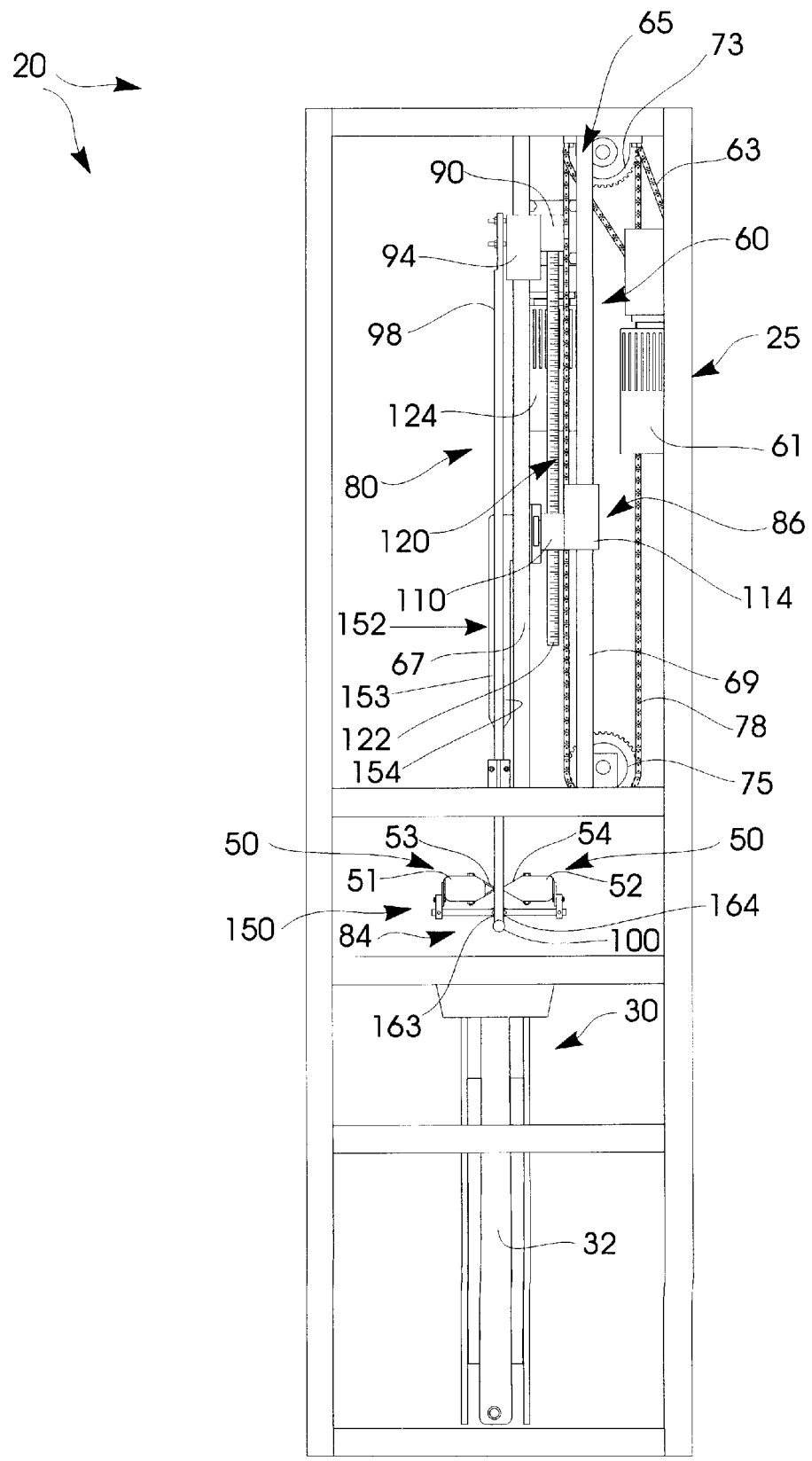
FIG. 3 is a partially fragmented side elevational view taken generally from the right side of FIG. 2, with portions broken away or omitted for clarity.
Figure 4:
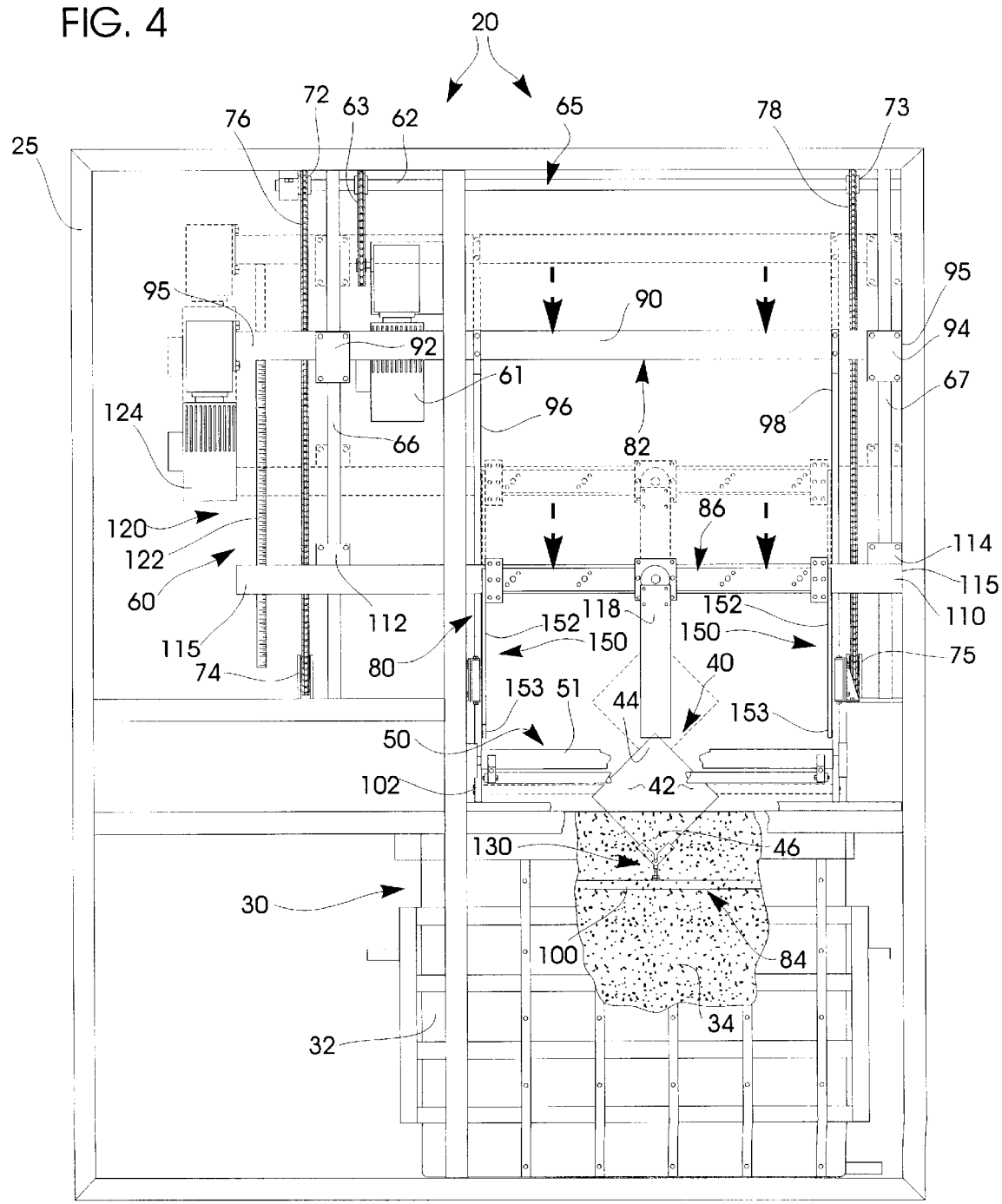
FIG. 4 is a partially fragmented front elevational view similar to FIG. 2, with portions broken away or omitted for clarity and with the dashed lines showing a moved position.
Figure 6:
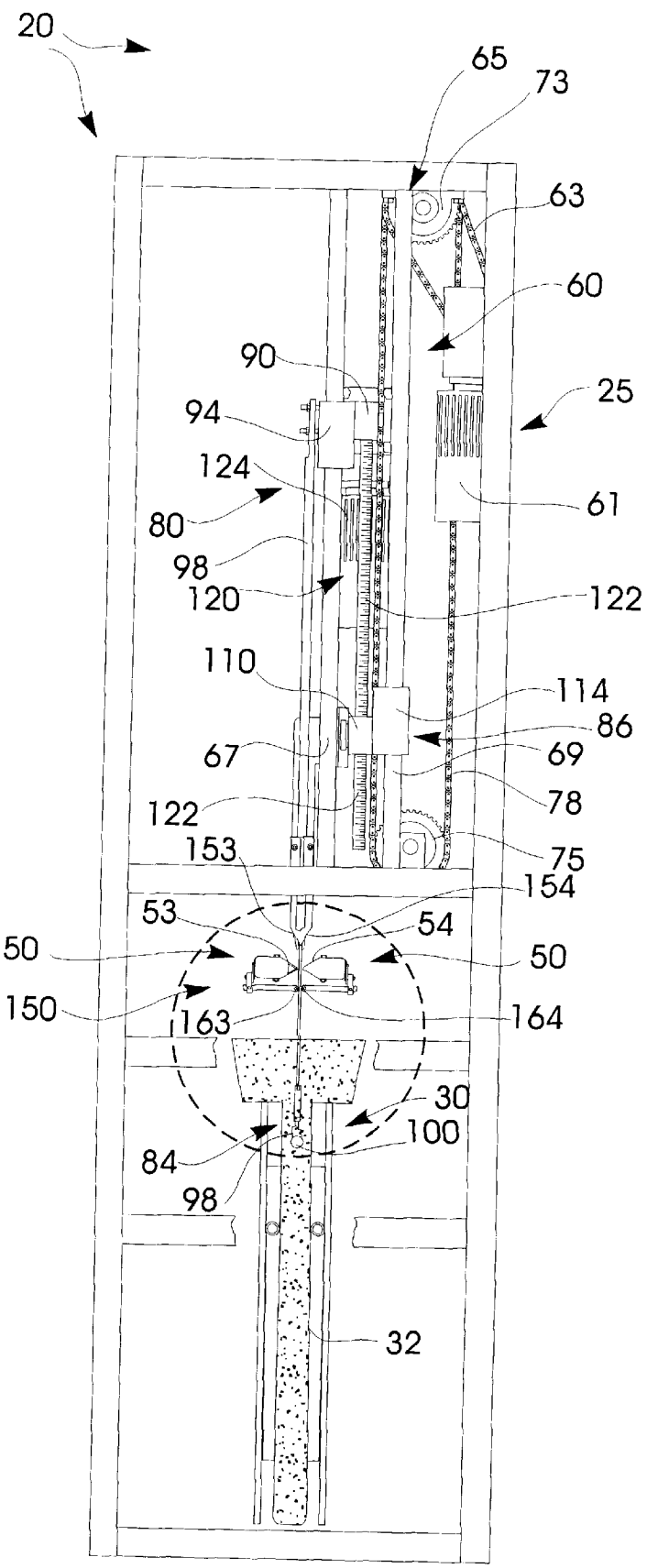
FIG. 6 is a partially fragmented front elevational view similar to FIG. 3, with portions broken away or omitted for clarity and with the dashed lines showing a moved position.
Figure 6A:
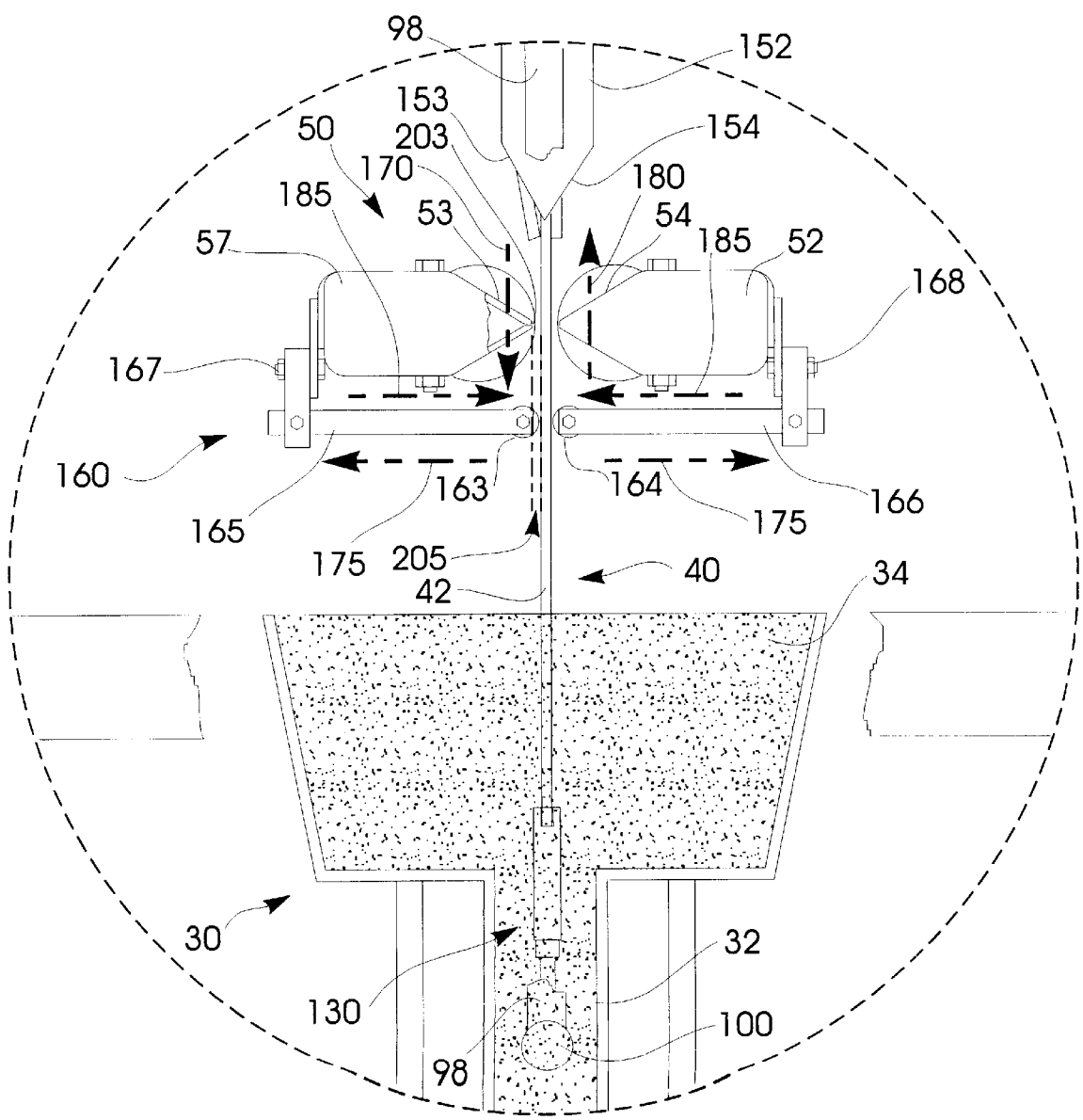
FIG. 6A is a greatly enlarged view of the encircled portion of FIG. 6, with portions broken away or omitted for clarity.
Figure 7:
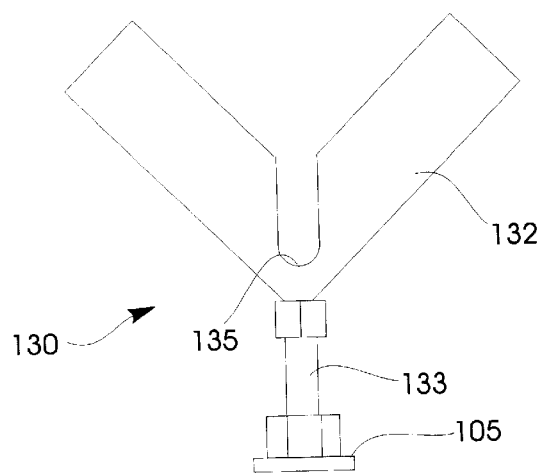
FIG. 7 is a front elevational view of the preferred lower holder.
Figure 8:
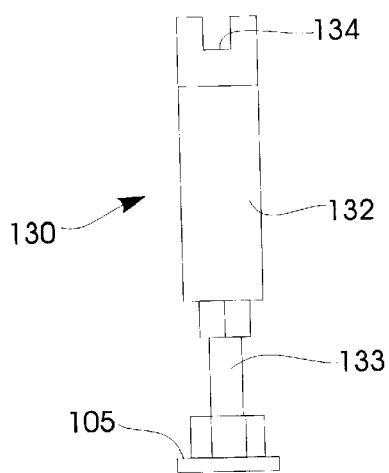
FIG. 8 is a side elevational view of the preferred lower holder with the opposite side being a mirror image thereof.
Figure 9:
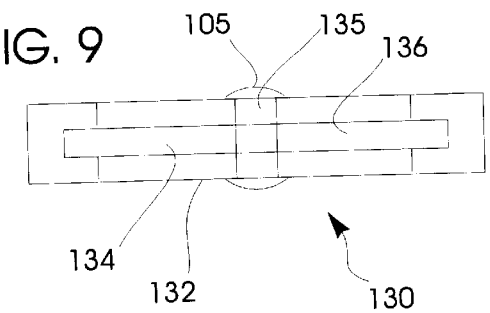
FIG. 9 is a top plan view of the preferred lower holder.
Figure 10:
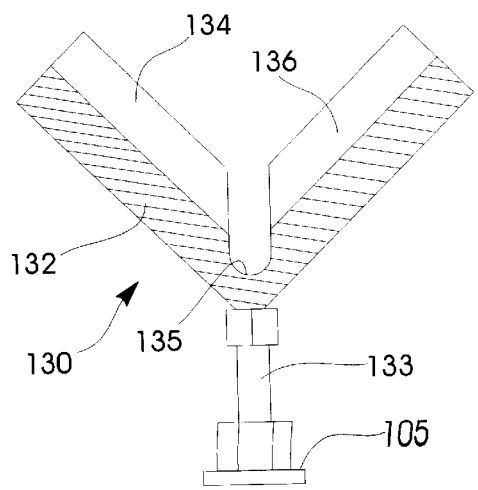
FIG. 10 is cross-sectional view taken along line 10—10 in FIG. 9.

Soldering machine 20 comprises a protective casing 25 that safely houses bath 30 and the associated piping and heating elements. During conventional solder processing, circuit boards 40 are dipped in bath 30 to mass solder the entire board circuitry in one step. Bath 30 comprises a reservoir 32 of molten solder 34 with an open top 36. When a board 40 is fully dipped into reservoir 32, molten solder 34 completely covers the inserted board 40. As the board 40 emerges from the solder 34, air knives 50 or the like forcefully blow any excess or entrained solder 35 (FIG. 1A) from the board's surface 42 and out through the various holes (not shown) defined in its surface. Splash guards 53, 54 on the edges of each air knife housing 57, 52 (FIG. 6A) prevent solder 35 from being splashed about the bath 30 and channel the solder 35 back into reservoir 32.

An operator controlled displacement mechanism 60 dips the circuit boards 40 into the bath 30. The displacement mechanism preferably comprises a motor 61 (FIGS. 2, 6) driving an axle 62 via chain 63 and a generally parallelepiped frame 65 proximate the bath 30. The frame 65 comprises four spaced apart parallel rails 66, 67, 68 (FIG. 1) and 69 that proximately abut the bath 30. A moving chassis 80 slides up and down rails 66, 67, 68 and 69 when selectively actuated by motor 61. Preferably, rails 66–69 are split into two sets of two rails to increase ride smoothness. Axle 62 drives two spaced apart pillow bearings 72 and 73. Pillow bearing 72 drives chain 76 around another spaced apart bearing 74. Pillow bearing 73 drives another chain 78 around another spaced apart bearing 75. Thus, chassis 80 is driven on both of its sides to ensure a smooth motion along rails 66–69.

Chassis 80 comprises at least three primary parallel, spaced apart members 82, 84 and 86. The upper member 82 preferably transversely extends between the rails 66, 67. A spaced apart, parallel lower member depends from the upper member 84. An adjustable intermediate member 86 is preferably disposed between the upper and lower members 82 and 84.

Preferably, the upper member 82 comprises an elongate bar 90. Bar 90 slidably captivates a portion of each rail 66, 67 at each of its spaced apart couplers 92, 94. Thus, upper member 82 may slide along rails 66, 67 via coupler 92, 94 respectively. Two spaced apart, parallel links 96 and 98 protrude downwardly interiorly of each coupler 92 and 94. Each link 96, 98 secures a terminal end 102, 104 of lower member 84.

Figure 5:
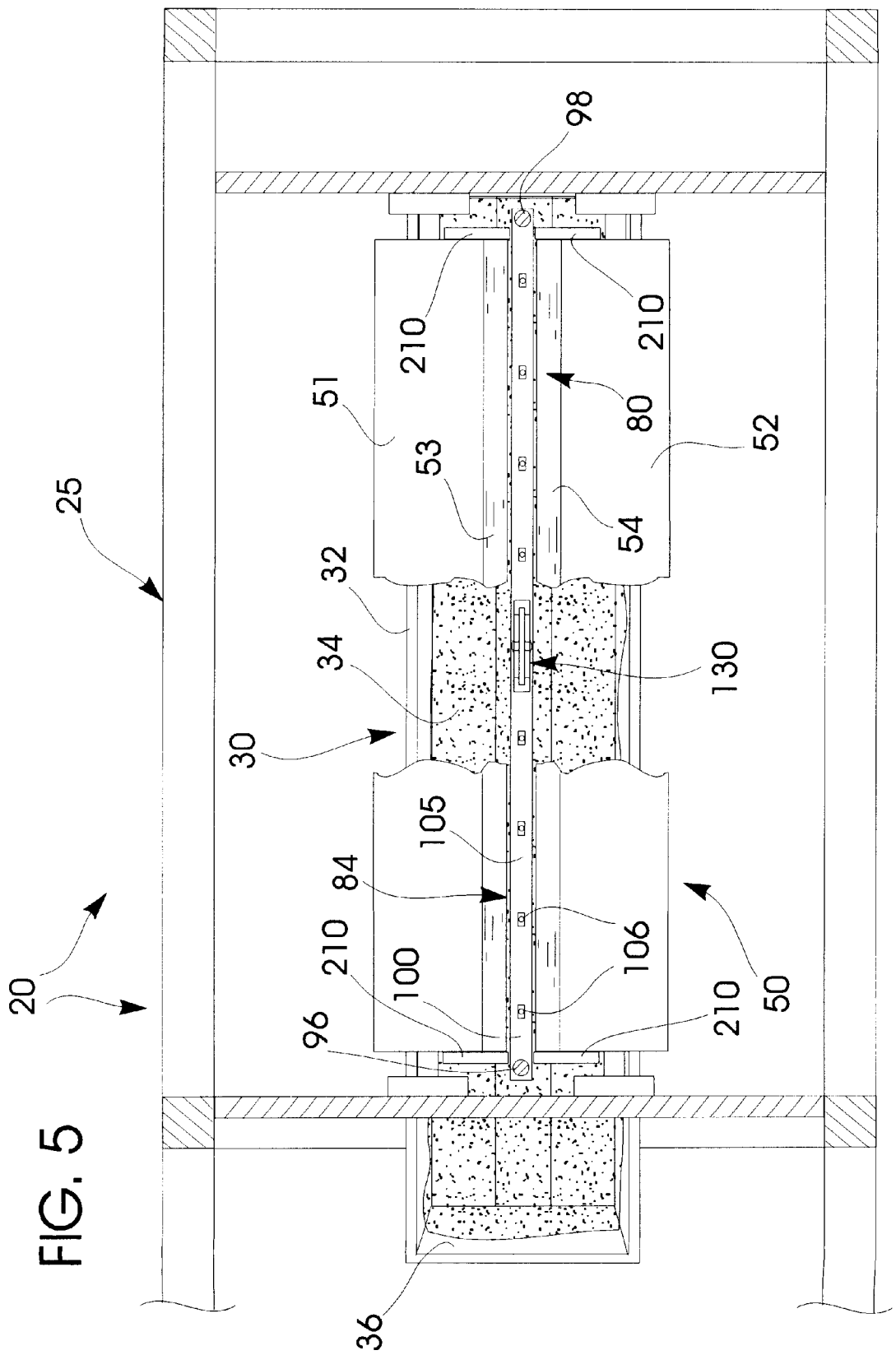
FIG. 5 is a cross-sectional view taken generally along line 5—5 in FIG. 4, with portions broken away or omitted for clarity.

The lower member 84 comprises an elongated tube 100 extending across the bath 30. Since tube 100 is inserted into reservoir 32 during board dipping, it is important that the tube length does not exceed the mouth length of the bath. Tube 100 has a flat top surface (FIG. 5). Surface 105 is preferably penetrated by several regularly spaced, threaded holes 106. The threaded holes 106 facilitate the coupling of lower holder 130 as will be discussed hereinafter. Holes 106 also evacuate excess or entrained solder 35 from surface 105 as the lower member 84 is raised from the reservoir 32.

The intermediate member 86 preferably comprises an elongated bar 110 dimensioned similarly to upper bar 90. Intermediate member 86 transversely extends between rails 68 and 69. Thus, intermediate couplers 112 and 114 are offset from upper couplers 92 and 94. Couplers 112 and 114 also slidably captivate another portion of rails 68 and 69 and enable member 86 to slide thereupon, respectively. However, bar 110 is not offset from bar 90 but is instead parallel to and beneath bar 90. Bar 110 supports a downwardly oriented pneumatic clamp 118. Operator actuated clamp 118 grasps the upper edge 44 of an inserted circuit board 40 during soldering. The lower holder 130 grasps the opposite lower edge 46 of the circuit board 40 to cooperatively stabilize it therebetween. The intermediate member 86 is preferably adjustable relative to lower member 84 so that variously sized circuit boards 40 to be inserted into machine 20.

Preferably, both terminal ends 115 of the intermediate member is coupled to the corresponding upper member ends 95 by an adjustment assembly 120. Adjustment assembly 120 comprises a screw jack 122 driven by motor 124. As the operator controls motor 124, screw jack 122 may raise or lower the intermediate member 86 to increase or decrease the distance between the upper and intermediate members 82 and 86 as is discussed more thoroughly hereinafter.

Figure 11:
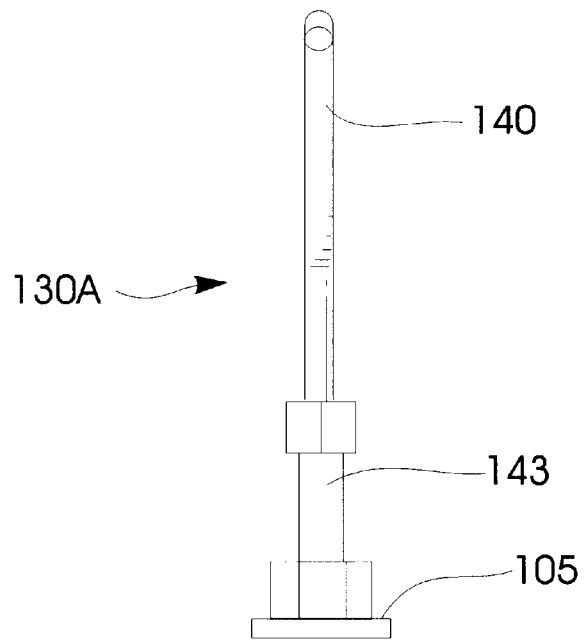
FIG. 11 is a front elevational view of an alternative lower holder.
Figure 12:
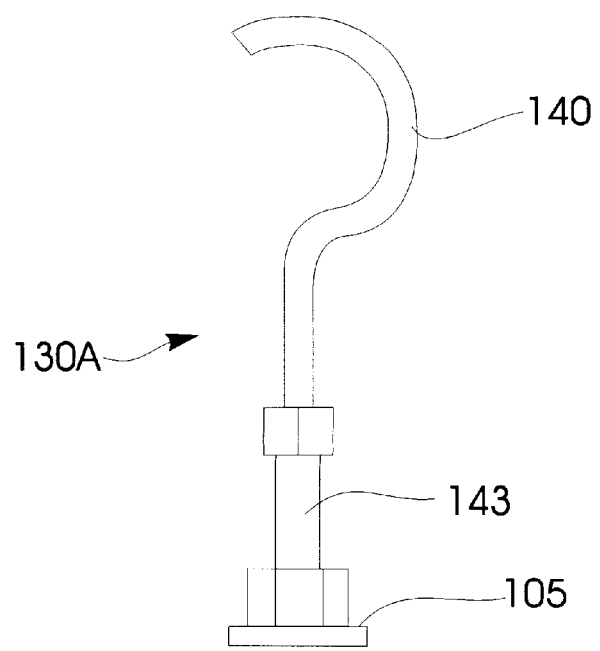
FIG. 12 is a side elevational view of the alternative lower holder, with the opposite side being a mirror image thereof.

Lower holder 130 protrudes upwardly from surface 105. Preferably, holder 130 comprises a grooved bracket 132 atop a threaded stud 133 (FIGS. 7–10). Bracket 132 is generally v-shaped and defines drain grooves 134 and 136 along its sides. A central drain opening 135 is defined at the union of grooves 134 and 136. Grooves 134 and 136 and opening 135 facilitate the ejection of excess or entrained solder 35 from holder 130 as it is raised from reservoir 32. An alternative holder 130A is shown in FIGS. 11 and 12. Holder 130A comprises a J-shaped hook 140 atop threaded stud 143. Hook 140 snags a convenient through hole in the bottom of circuit board 40.

A spreader assembly comprising a pair of spaced apart upper shafts 150 and corresponding spaced apart receiving rollers 160 spread the air knives 50 during chassis travel. Shafts 150 and rollers 160 align along the extreme edges of chassis 80 and bath 30 respectively. Each shaft 150 preferably comprises an elongated body 152 with a tapered end having outer edges 153, 154. Preferably, the tapered end of body 152 horizontally aligns with the terminal portions of clamp 118 so that air knife movement control is precise.

During chassis movement, each edge 153, 154 contacts a respective roller 210 and separates them. As the chassis continues downwardly, the rollers 210 are spread apart by shaft 152 as is discussed more fully hereinafter.

An alignment assembly ensures that the distance 205 between the air knife orifices 203 and the circuit board surface remains constant. This ensures front-to-back uniformity of the soldered circuit board. The alignment assembly comprises a pair of spaced apart, elongated rollers 163, 164. Preferably rollers 163, 164 extend for almost the entire width of bath 30. Preferably, rollers 163, 164 are Teflon coated to increase their operational life while maintaining their guidance capability. Rollers 163, 164 are adjustably mounted on rods 165, 166.

OPERATION

The basic manufacturing process is similar for most conventional vertical circuit board soldering machines. Generally, a circuit board is placed in an upper clamp that grips a top portion of the board. The board is then inserted into a molten solder bath to mass solder the circuitry on the board. The board is then removed after a sufficient residence time. The residence or dwell time for circuit board 40 depends upon the flux materials used and the temperature of the molten solder 34. Generally, the molten solder 34 temperature is between 475 and 500° F. and the dwell time is 2–8 seconds.

My improved soldering machine 20 uses a lower holder 130 to grip a lower edge 46 of the circuit board 40 during dipping. The holder cooperates with a clamp 118 intermediate member 84 to stabilize the board during dipping to prevent lateral or other undesirable board movements or vibrations. The intermediate member 86 may be adjusted via assembly 120 to vary the distance between clamp 118 and lower holder 130 to accommodate differently sized boards.

When a board 40 is dipped, the chassis 80 moves downwardly on rails 67, 69. As chassis 80 moves downwardly, lower member 84 passes rollers 160 without touching them as it enters bath 30. As intermediate member 86 approaches the bottom of rail 69 (as indicated by arrow 170 in FIG. 6A), the tapered shaft edges 153, 154 strike rollers 163, 164 and force them apart (indicated by arrows 175 in FIG. 6A).

When the intermediate member 86 and chassis 80 stop, rollers 163, 164 are aligned upon body 152. As the chassis 80 is raised upwardly (as indicated by arrow 180 in FIG. 6A), the rollers 163, 164 travel along body 152 until reaching edges 153, 154. Edges 153, 154 are aligned with the top of circuit board 40. As edges 153, 154 leave rollers 163, 164 (as indicated by arrows 185 in FIG. 6A), knives 50 are actuated to blow entrained solder 35 from the board surface 42.

Rollers 163, 164 are attached to each knife 50 via an adjustable rod 165, 166 to accommodate solder thickness on boards to maintain front-to-back uniformity. Rollers 163, 164 also alleviate potentially damaging abrasive contact between the air knifes and the circuit board during chassis movement. Rollers 163, 164 further minimize any circuit board bowing during chassis travel. Couplings 167, 168 control knife actuation using conventional activation apparatus. When the upper clamp is released to remove board 40, knives 50 cease operation and they are reset until shaft 150 again spreads rollers 210.

The air knife off-contact distance 205, preferably between 0.25 mm and 2 mm, is the distance between the air knife orifice 203 to the circuit board surface. Rollers 163, 164, while not actually normally touching the circuit board, keep it from vibrating as it moves upwardly past the air knife orifices.

The combined operation of the rails 67, 69, chassis 80, shafts 150 and rollers 160 maintain smooth board 40 entry into bath 30 while also ensuring precise air knife operation. Thus, undesirable air knife operation is prevented and undesirable slag blowing is minimized as well. Overall machine safety as well as circuit board precision are correspondingly increased too. Moreover, smooth board transition and redundant board support further maximize board precision.

From the foregoing, it will be seen that this invention is one well adapted to obtain all the ends and objects herein set forth, together with other advantages which are inherent to the structure.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

What is claimed is:

1. A solder bath system for circuit boards, said system comprising:

a reservoir containing molten solder, said reservoir having an open top for admitting said circuit boards;

displacement means for dipping said board into or out of said reservoir, said displacement means comprising clamping means for securing at least two opposed sides or ends of said boards when dipped within said bath, said clamping means comprising:

an upper clamp for grasping the top of said boards;

a lower holder for gripping the bottom of said boards; and, adjustment means for moving said upper clamp relative to said lower holder so that boards of different sizes can be inserted therebetween; and, spaced apart air knife means adjacent said top and actuated when said means for displacing raises said board from said bath, said knives forcefully blowing excess solder from said board as it moves past.

2. The system as defined in claim 1 wherein said lower holder comprises a bracket for supporting said bottom.

3. The system as defined in claim 1 wherein said lower holder comprises a hook for snagging said bottom.

4. A displacement system for a machine applying solder to a printed circuit board or the like by lowering said board into a bath containing molten solder and having means adjacent the bath top for forcefully blowing excess solder from said board as it moves past, said displacement system comprising:

a generally parallelepiped frame proximate said bath top, said frame comprising a pair of spaced apart, parallel elongated rails;

a moving chassis supported by said frame and adapted to selectively slide up or down said rails to enter or leave said bath, said chassis comprising clamping means for securing a circuit board at opposed edged as said board is dipped into said bath as said chassis slides along said rails, a transverse upper member slidably captivating a first portion of said rails, a lower, spaced apart member depending from said upper member, a transverse intermediate member slidably captivating a second portion of said rails, said intermediate member disposed between said upper and lower members, and means for adjustably positioning said intermediate member to vary the distance between said intermediate member and said lower member to accommodate various board sizes.

5. The system as defined in claim 4 wherein said clamping means comprises:

a holder adjustably secured to said lower member for gripping a portion of said circuit board; and, a pneumatic clamp secured to said intermediate member for grasping the portion of said circuit board opposite the portion gripped by said holder.

6. The system as defined in claim 5 wherein said clamping means further comprises means for ejecting liquid solder entrained upon either said lower member or said holder and alignment means for controlling the spacing between said circuit board and said means for ejecting.

7. The system as defined in claim 6 wherein said alignment means comprises:

roller means adjacent said means for ejecting for maintaining a preselected distance between said means for ejecting and said circuit board; and, rod means for adjustably positing said roller means relative to said circuit board.

8. The system as defined in claim 7 wherein said means for ejecting comprises:

a plurality of drainage holes defined in said lower member for evacuating molten solder therefrom; and, channel means defined in said holder to evacuate entrained molten solder entrained therefrom.

9. The system as defined in claim 8 wherein said lower holder comprises a bracket for supporting said bottom.

10. The system as defined in claim 9 wherein said lower holder comprises a hook for snagging said bottom.

11. A displacement system for a machine applying solder to a printed circuit board or the like by lowering said board into a bath containing molten solder and having means adjacent the bath top for forcefully blowing excess solder from said board as it moves past, said displacement system comprising:

a generally parallelepiped frame proximate said bath top, said frame comprising a pair of spaced apart, parallel elongated rails; and, a moving chassis supported by said frame and adapted to selectively slide up or down said rails to enter or leave said bath, said chassis comprising:

a transverse upper member slidably captivating a first portion of said rails;

a lower member depending from said upper member, said lower member spaced apart from said upper member and comprising a holder for gripping a portion of said circuit board;

a transverse intermediate member slidably captivating a second portion of said rails, said intermediate member disposed between said upper and lower members, said intermediate member comprising a clamp for grasping a portion of said circuit board opposite said holder;

means for adjustably positioning said intermediate member to vary the distance between said holder and said clamp to accommodate various circuit board sizes;

means for ejecting liquid solder entrained upon either said lower member or said holder as said lower member is withdrawn from said bath; and, alignment means for controlling the spacing between said circuit board and said means for ejecting, said alignment means comprises:

rollers means adjacent said means for ejecting for maintaining a preselected distance between said means for ejecting and said circuit board; and, rod means for adjustably positing said roller means relative to said circuit board.

12. The system as defined in claim 11 wherein said means for ejecting comprises:

a plurality of drainage holes defined in said lower member for evacuating molten solder therefrom; and, channel means defined in said holder to evacuate entrained molten solder entrained therefrom.

13. The system as defined in claim 12 wherein said lower holder comprises a bracket for supporting said bottom.

14. The system as defined in claim 13 wherein said lower holder comprises a hook for snagging said bottom.

* * * * *